(12) United States Patent
Hayashi (10) Patent No.: US 6,582,174 B1
(45) Date of Patent: Jun. 24, 2003

(54) SUBSTRATE PROCESSING APPARATUS AND SUBSTRATE PROCESSING METHOD

(75) Inventor: Akinari Hayashi, Tokyo (JP)

(73) Assignee: Kokusai Electric Co., Ltd., Tokyo (JP)

( * ) Notice: Subject to any disclaimer, the term of this patent is extended or adjusted under 35 U.S.C. 154(b) by 0 days.

(21) Appl. No.: 09/491,491

(22) Filed: Jan. 25, 2000

(30) Foreign Application Priority Data

Jan. 26, 1999 (JP) .......................................... 11-017267

(51) Int. Cl.[7] .............................................. H01L 21/68
(52) U.S. Cl. ............. 414/217; 414/331.02; 414/331.05; 414/416.05; 414/416.08; 414/940
(58) Field of Search .......................... 414/223.01, 217, 414/217.1, 416.01, 416.03, 416.08, 935, 937, 939, 940, 810, 811, 805, 806, 331.02, 331.03, 331.04, 331.05, 416.05; 118/719, 500; 104/35, 36; 432/239; 198/478.1

(56) References Cited

U.S. PATENT DOCUMENTS

| | | | | |
|---|---|---|---|---|
| 4,867,629 A | * | 9/1989 | Iwasawa et al. | 414/217 X |
| 4,886,412 A | * | 12/1989 | Wooding et al. | 414/217 X |
| 4,986,715 A | * | 1/1991 | Asakawa | 414/331.05 |
| 5,478,195 A | * | 12/1995 | Usami | 414/217 X |
| 5,697,749 A | * | 12/1997 | Iwabuchi et al. | 414/217 |
| 6,029,759 A | * | 2/2000 | Sue et al. | 198/465.4 |
| 6,083,357 A | * | 7/2000 | Begin et al. | 204/298.12 |

FOREIGN PATENT DOCUMENTS

| | | | | |
|---|---|---|---|---|
| JP | 02-139947 | | 5/1990 | |
| JP | 04-040534 | | 4/1992 | |
| JP | 40 4157752 | * | 5/1992 | 414/940 |
| JP | 08-148503 | | 6/1996 | |

* cited by examiner

Primary Examiner—Steven A. Bratlie
(74) Attorney, Agent, or Firm—Hogan & Hartson, LLP (57) ABSTRACT

A substrate processing apparatus includes a rotation accommodating shelf and a transfer machine. The rotation accommodating shelf is capable of accommodating a plurality of accommodating containers in which substrates are to be loaded. The transfer machine is for transferring the plurality of accommodating containers to the rotation accommodating shelf. The plurality of accommodating containers are respectively disposed on radial lines, which radiate from a rotation center of the rotation accommodating shelf, such that each accommodating container is respectively inclined in a horizontal plane in a same fixed direction with respect to a radial line.

20 Claims, 12 Drawing Sheets

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method, and more particularly, to a substrate processing apparatus and a substrate processing method for subjecting a substrate such as a silicon wafer to substrate processing such as film formation for manufacturing a semiconductor device.

2. Description of the Related Art

As a substrate processing apparatus, there exists a single substrate or a small number of substrates processing type apparatus in which a substrate is processed one sheet by one sheet or a small number of sheets by a small number of sheets, and a batch type substrate processing apparatus in which a large number of substrates are processed at a time. In the batch type substrate processing apparatus, usually, substrates are transferred into the apparatus in a state where twenty five substrates are loaded at a time in a substrate cassette which is an open type accommodating container or in an FOUP (Front Opening Unified Pod) which is a closed type accommodating container, and one hundred wafers are processed in one processing step (hereinafter referred to as one batch). In this case, in order to enhance the throughput, fourteen accommodating containers in total are accommodated in the substrate processing apparatus for accommodating wafers for two batches including dummy wafers, monitor wafers, fill-dummy wafers and the like in addition to product wafers.

In a production factory of a semiconductor device and the like, an apparatus for processing a substrate such as a semiconductor wafer is usually disposed in a clean room. In this case, it is preferable that an area occupied by the apparatus is smaller. However, a substrate processing apparatus in which a large number of substrate accommodating containers are accommodated as described above occupies a large area, and it has been desired to reduce an apparatus occupying area.

SUMMARY OF THE INVENTION

According to a first aspect of the present invention, there is provided a substrate processing apparatus, including a rotation accommodating shelf capable of accommodating a plurality of accommodating containers in which substrates are to be loaded and having a rotation mechanism for rotating the rotation accommodating shelf, and a transfer machine for transferring the plurality of accommodating containers to the rotation accommodating shelf, wherein the plurality of accommodating containers are respectively disposed on radial lines, which radiate from a rotation center of the rotation accommodating shelf, such that each accommodating container is respectively inclined in a horizontal plane in a same fixed direction with respect to a radial line.

According to a second aspect of the present invention, there is provided a substrate processing apparatus, including:

a rotation accommodating shelf capable of accommodating a plurality of accommodating containers in which substrates are to be loaded, and a transfer machine for transferring the plurality of accommodating containers to the rotation accommodating shelf, wherein the plurality of accommodating containers are respectively disposed on radial lines, which radiate from a rotation center of the rotation accommodating shelf, such that each accommodating container is respectively inclined in a horizontal plane in a same fixed direction with respect to a radial line.

According to a third aspect of the present invention, there is provided a substrate processing apparatus, including:

a rotation accommodating shelf capable of accommodating a plurality of accommodating containers in which substrates are to be loaded, and a transfer machine for transferring the plurality of accommodating containers to the rotation accommodating shelf, wherein the plurality of accommodating containers are respectively disposed on radial lines, which radiate from a rotation center of the rotation accommodating shelf, such that each accommodating container is respectively inclined in a horizontal plane in a same fixed direction with respect to a radial line; and the accommodating container is disposed to be inclined with respect to the radial line such that the transfer machine can send or receive the accommodating container at an accommodating container sending/receiving position where the transfer machine sends the accommodating container which is to be disposed in the rotation accommodating shelf or receive the accommodating container disposed in the rotation accommodating shelf.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 9:
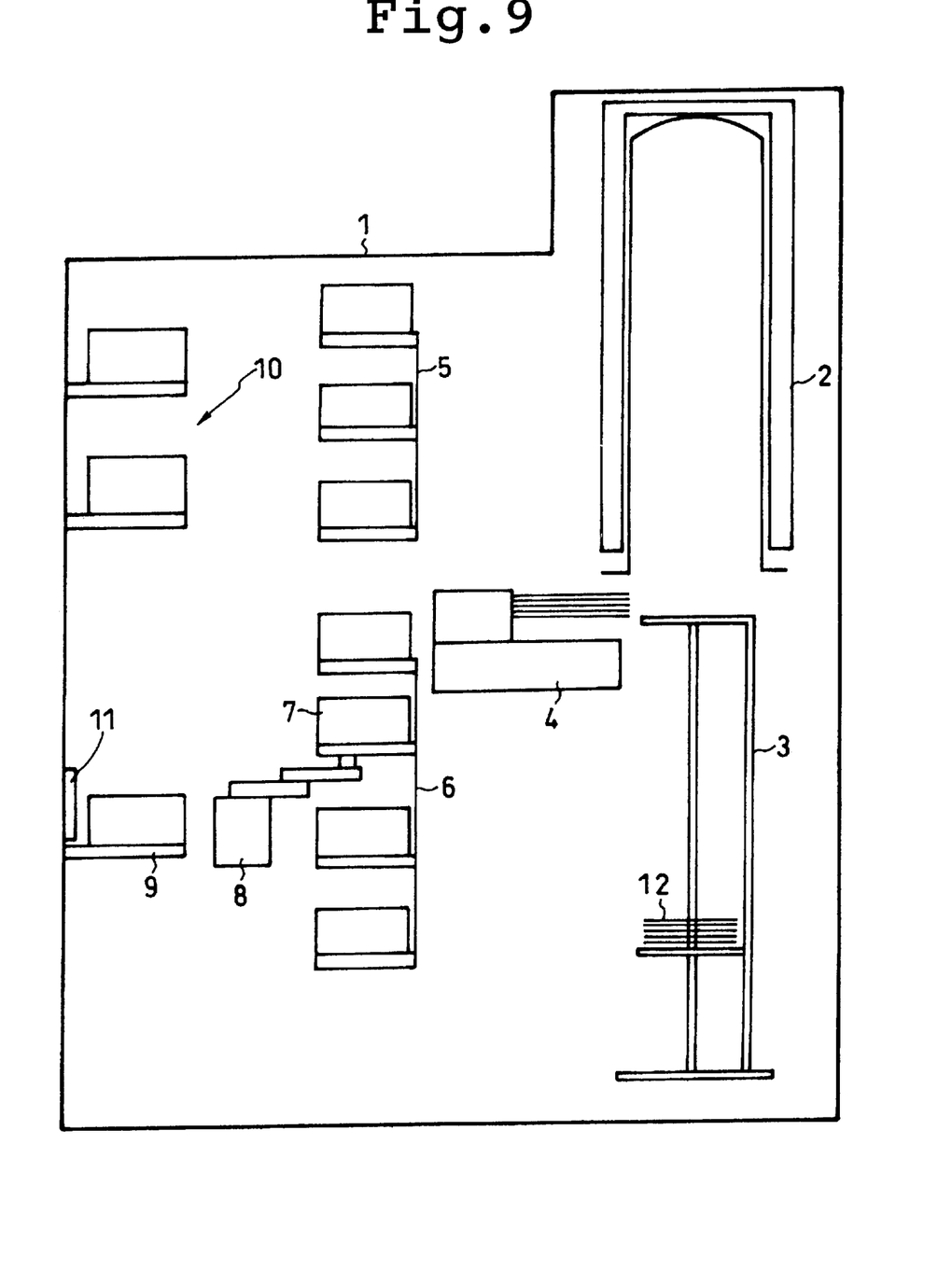
FIG. 9 is a schematic longitudinal sectional view for explaining a substrate processing apparatus wherein wafers are accommodated in a wafer cassette and transferred.

To achieve the above object, the present inventor first analyzed a substrate processing apparatus shown in FIG. 9. Referring to FIG. 9, a substrate processing apparatus will be explained in which substrates are accommodated in substrate cassettes and transferred.

A reaction furnace 2 is provided at a rear and upper portion in a cabinet 1, and a boat 3 can be inserted into and pulled out from the reaction furnace 2 from below by means of a boat elevator (not shown). In a state where the boat is lowered, a wafer moving machine 4 is provided in front of the boat 3, and an upper cassette accommodating shelf 5 and a lower cassette accommodating shelf 6 are provided in front of the wafer moving machine 4. The upper cassette accommodating shelf 5 can accommodate therein six wafer cassettes 7 in two rows and three columns, the lower cassette accommodating shelf 6 can accommodate therein eight wafer cassettes 7 in two rows and four columns, and the upper and lower cassette accommodating shelves 5 and 6 can accommodate fourteen wafer cassettes 7 in total.

A cassette transfer machine 8 is provided in front of the upper and lower cassette accommodating shelves 5 and 6, and a cassette stage 9 is provided in front of the cassette transfer machine 8. Cassette sub-accommodating shelves 10 are provided above the cassette stage 9. A cassette IN-OUT port 11 adjacent to the cassette stage 9 is provided in a front face of the cabinet 1.

Wafers 12 are transferred in a stage where the wafers 12 are loaded in the wafer cassette 7. The wafer cassette 7 is transferred onto the cassette stage 9 through the cassette IN-OUT port 11 by an AGV (Automated Guided Vehicle; not shown) which runs on a floor. The cassette transfer machine 8 transfers the wafer cassette 7 from the cassette stage 9 to the upper cassette accommodating shelf 5, the lower cassette accommodating shelf 6 or the cassette sub-accommodating shelf 10 by vertical movement, rotation movement and lateral movement.

The wafer transfer machine 4 transfers the wafers 12 in the wafer cassette 7 which have been transferred in the lower accommodating shelf 6 to the lowered boat 3 by vertical movement, rotation movement and lateral movement. When the necessary number of wafers 12 are loaded into the boat 3, the boat elevator (not shown) hoists the boat 3 and inserts the latter into the reaction furnace 2.

After the wafers 12 are subjected to necessary processing in the reaction furnace 2, the boat elevator (not shown) lowers the boat 3 and pulls out the latter from the reaction furnace 2. After the boat 3 and the wafers 12 are cooled, the wafer transfer machine 4 transfers the wafers 12 into the wafer cassettes 7 in the lower cassette accommodating shelf 6.

Further, wafers 12 to be processed next are loaded into the boat 3 by the wafer transfer machine 4, and necessary processing steps for the wafers 12 are repeated in the same procedure as that described above. Each of the wafers 12 which has been subjected to the necessary processing and moved into the wafer cassettes 7 are transferred out through the cassette transfer machine 8, the cassette stage 9 and the cassette IN-OUT port 11 by reversing the above procedure.

In this apparatus, the wafer cassette 7 can be accommodated only in a position that can directly access the cassette transfer machine 8 which transfers the wafer cassettes 7, and the present inventor has found that there is a problem that in order to secure the necessary number of wafer cassettes, an access stroke of the cassette transfer machine 8 must be increased, or width or height of the apparatus must be increased.

When the wafers 12 are accommodated in the wafer cassette 7 and transferred as described, particles in the air adhere to surfaces of the wafers 12 during transfer, or unnecessary oxide films are generated in some cases, and there is a possibility that this has an adverse effect on the quality of a product. Thereupon, recently, in order to enhance the quality of a product, the wafers 12 are accommodated in an FOUP which is a closed type accommodating container to cut off from the atmosphere and are transferred.

Figure 10:
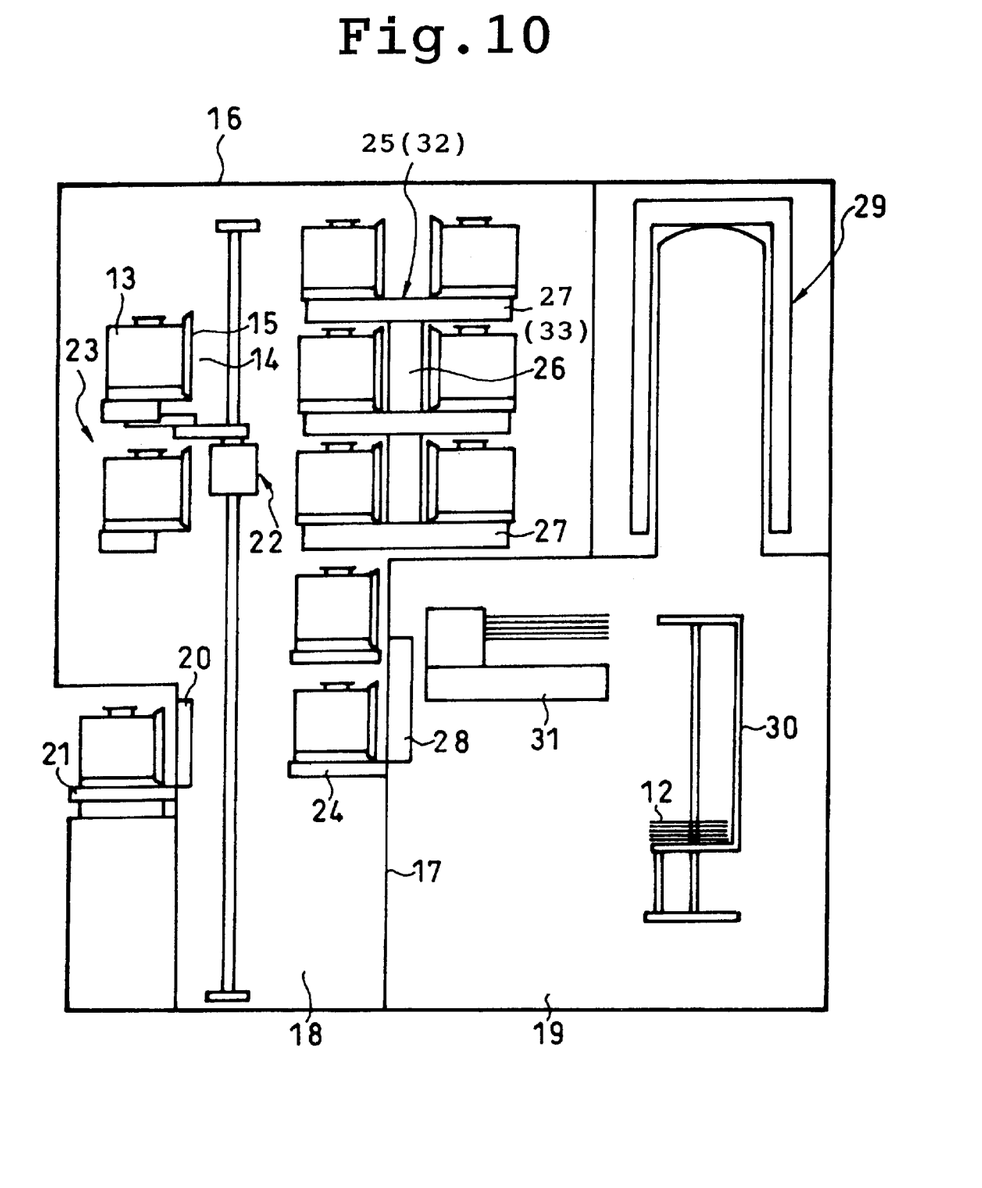
FIG. 10 is a schematic longitudinal sectional view for explaining a substrate processing apparatus wherein wafers are accommodated in a FOUP (Front Opening Unified Pod) and transferred.
Figure 11:
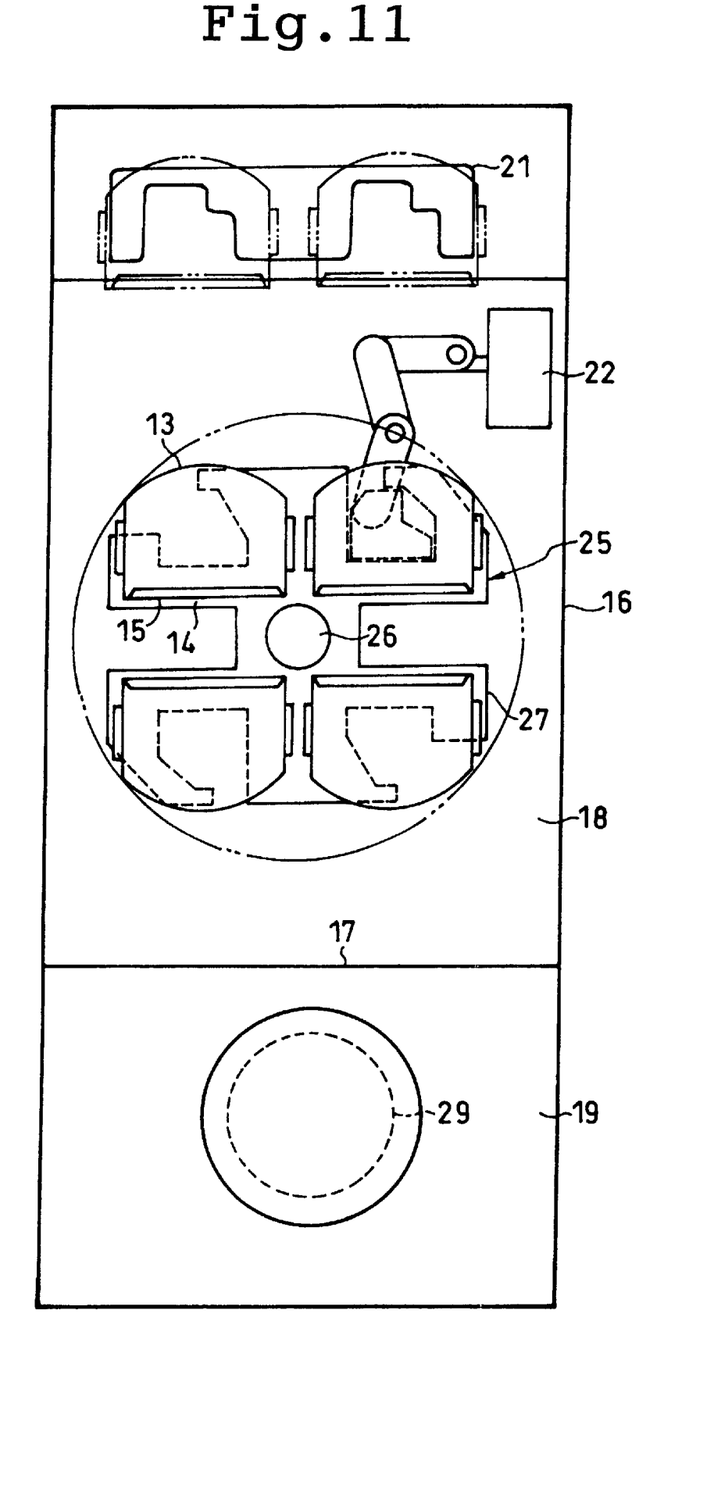
FIG. 11 is a schematic transversal sectional view of FIG. 10.

As shown in FIGS. 10 and 11, the outside shape of the FOUP 13 is of oblong semicolumnar, one side face of the FOUP 13 is an open face 14 through which the wafer 12 is inserted or removed, and the open face 14 is closed with a lid 15 air-tightly. The width of the FOUP 13 in a direction parallel to the open face 14 is longer than the length of the FOUP 13 in a direction perpendicular to the open face 14.

Next, the present inventor analyzed a substrate processing apparatus using the FOUP 13 as a substrate accommodating container shown in FIGS. 10 and 11.

Referring to FIGS. 10 and 11, the interior of a cabinet 16 is air-tightly partitioned by a partition wall 17, a front portion of the partitioned interior in front of the partition wall 17 is a cassette transfer chamber 18 of atmospheric atmosphere, and a rear portion of the partitioned interior behind the partition wall 17 is a wafer moving chamber 19 of inert gas atmosphere.

The cabinet 16 is provided at its front face with an FOUP IN-OUT port 20, and an FOUP stage 21 is provided in front of the FOUP IN-OUT port 20.

In the cassette transfer chamber 18, an FOUP transfer machine 22 is provided behind the FOUP IN-OUT port 20, and an FOUP sub-accommodating shelf 23 is provided in front of the FOUP transfer machine 22 and above the FOUP stage 21. An FOUP sending/receiving unit 24 is provided behind the FOUP transfer machine 22, and an FOUP rotation accommodating shelf 25 capable of rotating is provided above the FOUP sending/receiving unit 24.

The FOUP rotation accommodating shelf 25 includes a rotation mechanism 26 provided vertically, and three column shelf plates 27 mounted to the rotation mechanism 26. Each of the shelf plates 27 can accommodate four FOUPs 13 and thus, twelve FOUPs 13 can be accommodated in the FOUP rotation accommodating shelf in total. The FOUPs 13 are juxtaposed front and rear two each on each of the shelf plates 27. The open faces 14 of the two FOUPs 13 disposed rear are directed forward, and the open faces of the other two FOUP 13 disposed front are directed rearward. These four FOUPs 13 are disposed symmetrically in a left/right direction and a forward/backward direction.

The partition wall 17 is provided with a wafer IN-OUT port 28, and the wafer IN-OUT port 28 is opened and closed by a lid open/close mechanism (not shown).

A reaction furnace 29 is provided at a rear and upper portion in the wafer moving chamber 19, and a boat 30 can be inserted into and pulled out from the reaction furnace 29 from below by means of a boat elevator (not shown). A wafer transfer machine 31 is provided between the wafer IN/OUT port 28 and the lowered boat 30.

The wafers 12 are transferred in a state where the wafers 12 are loaded into the FOUP 13 and the latter is tightly closed, and the wafers 12 are transferred onto the FOUP stage 21, by an AGV (not shown) which runs on the floor, in a state where the open face 14 is directed backward (rightward in FIG. 10). The FOUP rotation accommodating shelf 25 rotates to move the next FOUP 13 accommodation position to a forward FOUP sending/receiving position, and waits in this state. The FOUP transfer machine 22 transfers the FOUP 13 from the FOUP stage 21 to the FOUP rotation accommodating shelf 25 or the FOUP sub-accommodating shelf 23 through the FOUP IN/OUT port 20 by vertical movement, rotation movement and lateral movement, and the FOUP 13 is accommodated in FOUP rotation accommodating shelf 25 or the FOUP sub-accommodating shelf 23. The above-described operation is repeated, and the necessary number of FOUPs 13 are transferred to the FOUP rotation accommodating shelf 25 and the FOUP sub-accommodating shelf 23.

Next, when the wafers 12 are moved to the boat 30, the FOUP rotation accommodating shelf rotates to move the FOUP 13 which is to be moved to the FOUP sending/receiving position, and waits in this state. The FOUP transfer machine 22 again transfers the FOUP 13 from the FOUP rotation accommodating shelf 25 to the FOUP sending/receiving unit 24, or from the FOUP sub-accommodating shelf 23 to the FOUP sending/receiving unit 24 by vertical movement, rotation movement and lateral movement. The FOUP 13 is placed on the FOUP sending/receiving unit 24 in a state where its open face 14 is directed rearward.

After the open face 14 of the FOUP 13 is brought into close contact with a peripheral edge of the wafer IN/OUT port 28, the lid open/close mechanism (not shown) opens the wafer IN/OUT port 28, and the lid 15 is removed from the FOUP 13. The wafer transfer machine 31 moves the wafer 12 in the FOUP 13 to lowered the boat 30 by vertical movement, rotation movement and lateral movement. The moving operation of the wafers 12 to the plurality of FOUPs 13 is carried out until the number of wafers 12 reaches the predetermined number. When the necessary number of wafers 12 are loaded on the boat 30, the boat elevator (not shown) hoists the boat 30 and inserts the boat 30 into the reaction furnace 29.

After the wafers 12 are subjected to the necessary processing in the reaction furnace 29, the boat elevator (not shown) lowers the boat 30 and pulls out the latter from the reaction furnace 29. After the boat 30 and the wafers 12 are cooled down to a predetermined temperature, the processed wafers 12 are transferred out by reversing the above procedure.

As described at the beginning, it is usually necessary to accommodate fourteen FOUPs 13 in total for two batches in the apparatus.

However, in a substrate processing apparatus provided with the FOUP rotation accommodating shelf 25 capable of accommodating the FOUPs 13 four each on each of the shelf plates 27, only twelve FOUPs 13 can be accommodated at the maximum in the FOUP rotation accommodating shelf 14. Further, the FOUP sending/receiving unit 24 and the lid open/close mechanism (not shown) are disposed below the FOUP rotation accommodating shelf 25 and thus, space for disposing another FOUP accommodating shelf can not be secured. Therefore, it was necessary to dispose the FOUP sub-accommodating shelf 23 above the FOUP stage 21. However, the FOUP 13 is transferred to the substrate processing apparatus by means of an OHT (Over Head Transfer) method, in which a FOUP transfer machine runs along rails attached to a ceiling of a clean room, rather than the AGV transfer method in some cases. In the case of the OHT, since the FOUP 13 is transferred to the FOUP stage 21 from above, the FOUP sub-accommodating shelf 23 can not be disposed above the FOUP stage 21. Therefore, the only possible way to carry out the OHT method is to increase the number of shelf plates of the FOUP rotation accommodating shelf 25. However, the present inventor has found that there is an adverse possibility that there are problems that if the number of the shelf plates of the FOUP rotation accommodating shelf 25 is increased, the height of the entire apparatus becomes too high and the height exceeds a height limit, dismantling and assembling operations of the apparatus at the time of installation are complicated, and installation location of the apparatus is limited.

Figure 12:
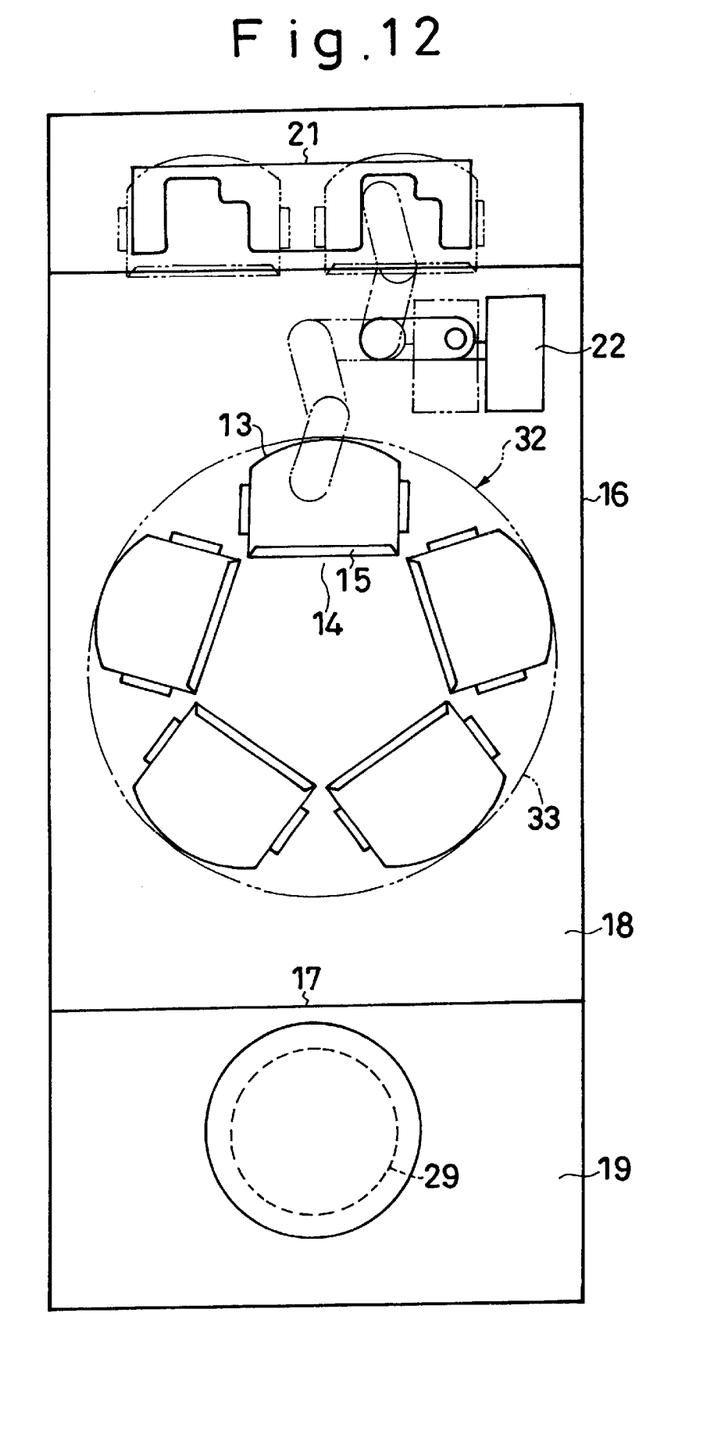
FIG. 12 is a schematic longitudinal sectional view for explaining a substrate processing apparatus provided with a FOUP rotation accommodating shelf capable of accommodating five FOUPs on each of its shelf plates.

Next, the present inventor analyzed a substrate processing apparatus provided with an FOUP rotation accommodating shelf 32 capable of accommodating five FOUPs 13 on each of its shelf plates as shown in FIGS. 10 and 12.

In FIG. 12, members which are the same as those shown in FIG. 11 are designated with the same numbers, and explanation thereof is omitted.

The FOUP rotation accommodating shelf 32 includes three column shelf plates 33. On each of the shelf plates 33, five FOUPs 13 are placed such that the FOUPs 13 radially form a regular pentagon around a rotation center of the FOUP rotation accommodating shelf 32, and the FOUP rotation accommodating shelf 32 can accommodate, as a whole, fifteen FOUPs 13 in total.

The transfer procedure of the FOUPs 13 between the FOUP rotation accommodating shelf 32 and the FOUP sending/receiving unit 24 is the same as in the former case in which each of the shelf plates of the FOUP rotation accommodating shelf 32 accommodates four FOUPs 13 and thus, its explanation is omitted.

In the substrate processing apparatus provided with such an FOUP rotation shelf 32 capable of accommodating five FOUPs 13 on each of its shelf plates, the FOUPs 13 are disposed such as to form the regular pentagon. The width of the FOUP 13 in a direction parallel to the open face 14 is longer than the length of the FOUP 13 in a direction perpendicular to the open face 14, and the FOUPs 13 are disposed such that the open faces 14 thereof do not interfere with one another. Therefore, the size of the FOUP rotation accommodating shelf 32 in a plane is mainly determined by the width of the FOUP 13. The present inventor has found hat there is a problem that in such disposition, wasteful space is generated in a center portion of the FOUP rotation accommodating shelf 32 and therefore, the size of the FOUP rotation accommodating shelf 32 in a plane is excessively large, the widthwise size of the entire apparatus is determined by the diameter of a rotation circle of the FOUP rotation accommodating shelf 32, and the apparatus is adversely increased in size.

In view of the above circumstances, the present inventor has invented a substrate processing apparatus of the following embodiment capable of effectively accommodating the necessary number of containers such as FOUPs in a rotation accommodating shelf, and capable of carrying out the AGV transfer and OHT without increasing the entire apparatus in size.

Next, embodiments of the present invention will be explained with reference to the drawings.

(First Embodiment)

First, with reference to FIGS. 1 to 3, a first embodiment of the present invention will be explained.

Figure 1:
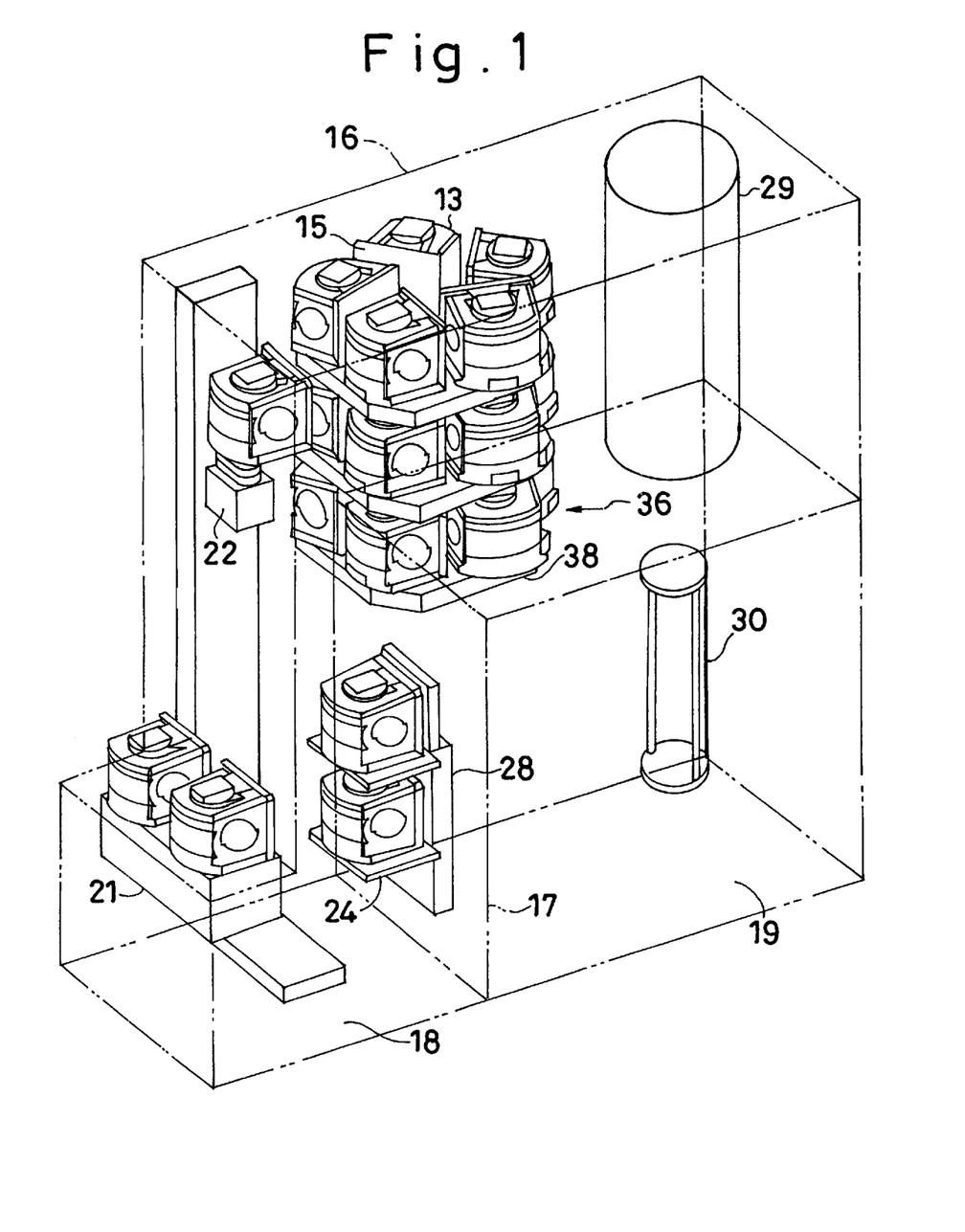
FIG. 1 is a schematic perspective view for explaining a substrate processing apparatus according to a first embodiment of the present invention.
Figure 2:
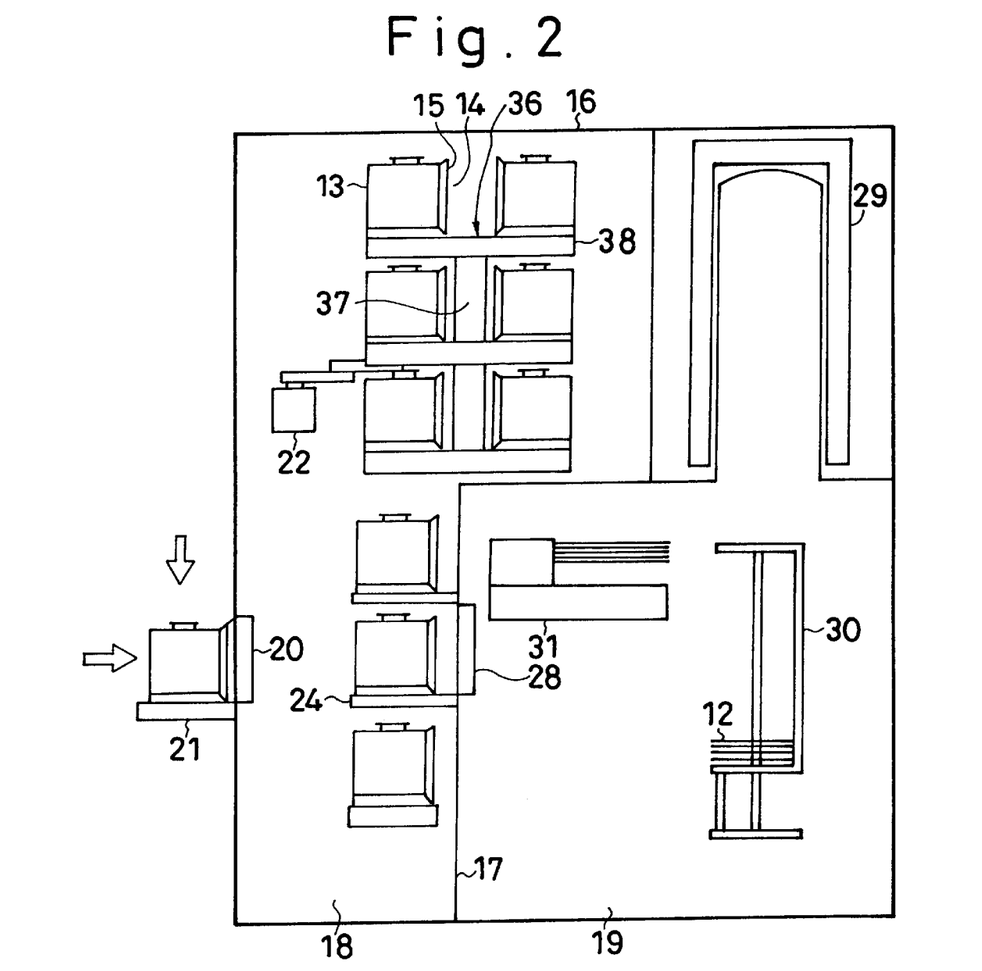
FIG. 2 is a schematic longitudinal sectional view for explaining the substrate processing apparatus according to the first embodiment of the present invention.
Figure 3:
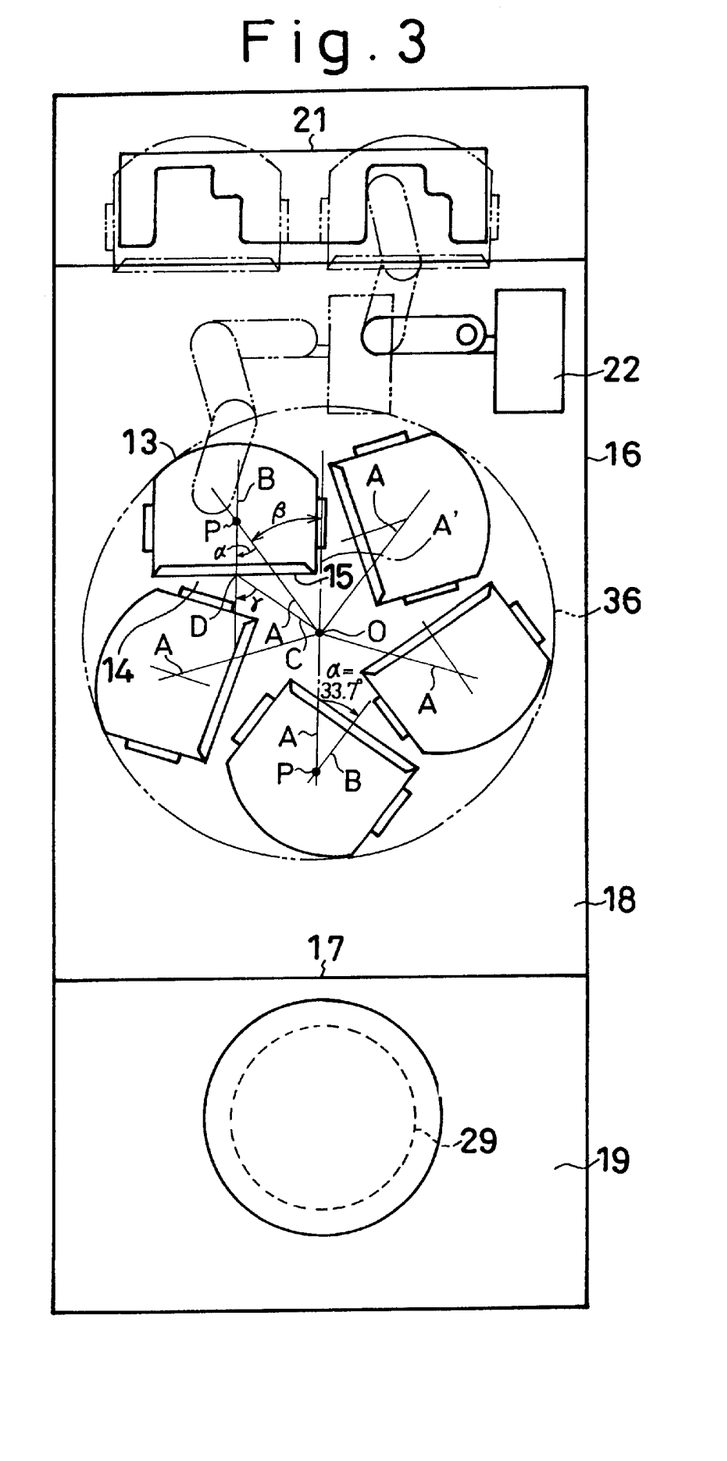
FIG. 3 is a schematic transversal sectional view for explaining the substrate processing apparatus according to the first embodiment of the present invention.

In FIGS. 1 to 3, member which are the same as those shown in FIGS. 11 to 13 are designated with the same numbers, and explanation thereof is omitted.

In a cassette transfer chamber 18, an FOUP transfer machine 22 is provided along a front face of a cabinet 16. An FOUP rotation accommodating shelf 36 capable of rotating is provided at a rear and upper portion of the FOUP transfer machine 22, and an FOUP sending/receiving unit 24 is provided below the FOUP rotation accommodating shelf 36.

The FOUP rotation accommodating shelf 36 comprises a rotation mechanism 37 and three column shelf plates 38 supported by the rotation mechanism 37. In each of the shelf plates 38, five FOUPs 13 can be accommodated on a circle whose center is a rotation center point 0 of the shelf plate 38 and respectively on radial lines A which equally divide the circle into five and which pass through the rotation center point O of the shelf plate 38. That is, the five FOUPs 13 are disposed at positions at an equal distance from the rotation center point O, and angles defined between adjacent two radial lines are equal to one another. Fifteen FOUPs 13 in total can be accommodated in the FOUP rotation accommodating shelf 36.

On each of the shelf plates 38, the FOUPs 13 are disposed such that an angle α defined between each of lines B perpendicular to respective open faces 14 of the FOUPs 13 and passing through a centroid P and each of radial lines A is 33.7°, for example. That is, the FOUPs 13 are respectively disposed at positions deviated from the radial lines A by an offset angle of α (=33.7°). At that time, the line B perpendicular to the open face 14 at a central portion D of the open face 14 and a straight line C passing through the central portion D and the rotation center point O is inclined by an angle γ with respect to each other.

As can be seen in FIG. 3, with the angle α, the FOUP 13 which is to be sent or received is opposed to the FOUP transfer machine 22 in a state where the FOUP rotation accommodating shelf 36 is stopped at a sending/receiving position of the FOUP, and with this angle, adjacent FOUPs 13 do not project to a transfer path of the FOUPs 13 when the FOUPs 13 are sent or received between the FOUP stage 21 and the FOUP sending/receiving position of the FOUP rotation accommodating shelf 36 by the FOUP transfer machine 22. Further, this angle α is equal to a rotation-stop angle of the FOUP rotation accommodating shelf 36, i.e., an angle β defined between the radial line A passing through the FOUP 13 which is to be sent or received and a center line A' of the apparatus passing through the rotation center point O. That is, the FOUP 13 is sent or received at a position deviated laterally by the angle β (=α) from the center line A' of the apparatus.

With the above-described disposition of the FOUPs 13, space utilization ratio above the shelf plate 38 is increased, and each of the shelf plates 38 can efficiently accommodate the FOUPs 13. Further, according to this disposition of the FOUP 13 on the shelf plate 38, a pitch between the FOUPs 13 in the circumferential direction is not determined by the size of the of the FOUP 13 in the widthwise direction parallel to the open face 14 and therefore, it is possible to shorten the diameter of the FOUP rotation accommodating shelf 36 in a plane.

Referring to FIGS. 4 to 7, the rotation mechanism 37 will be generally explained.

Figure 4:
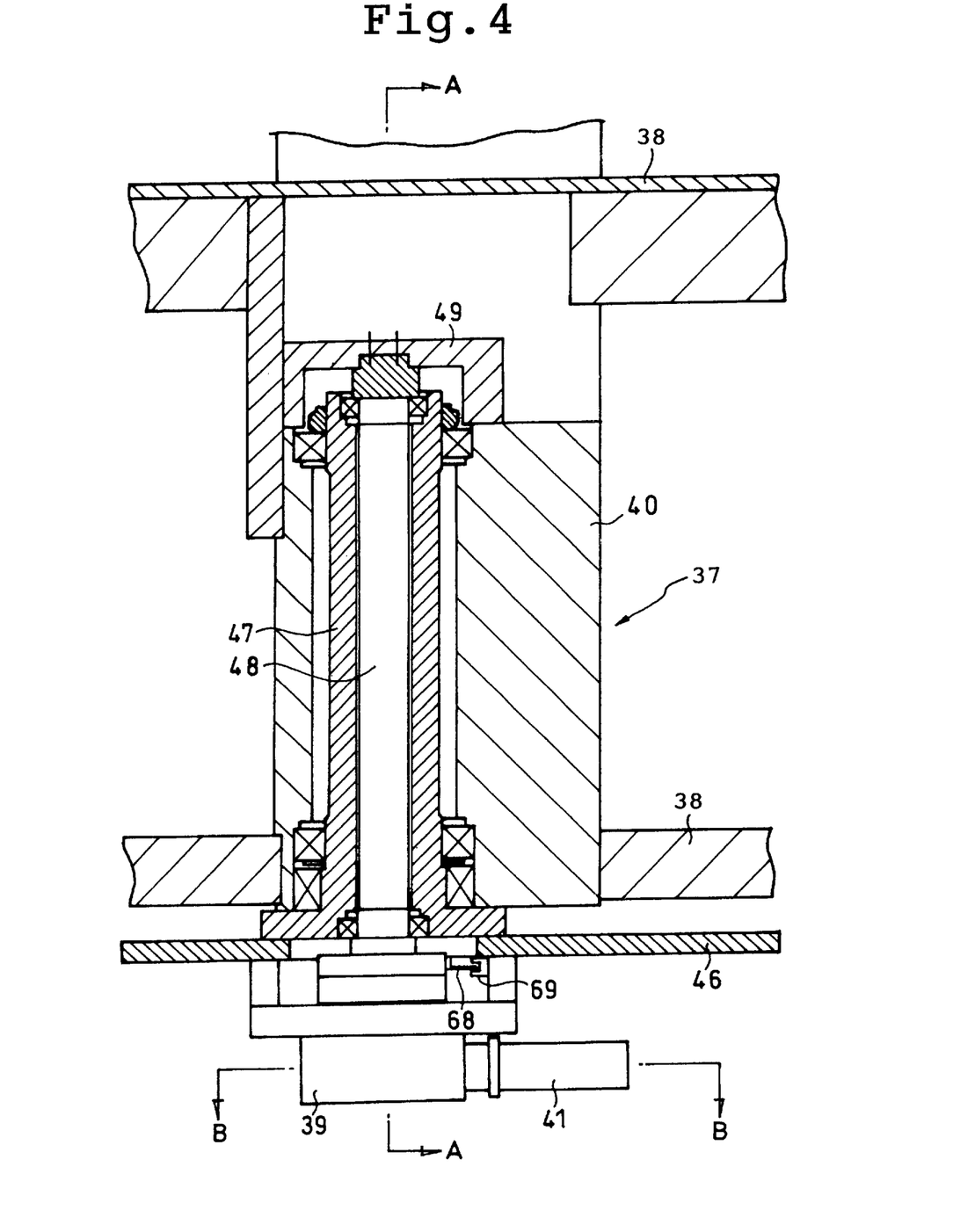
FIG. 4 is a longitudinal sectional view for explaining a rotation mechanism for a rotation accommodating shelf according to first to third embodiments of the present invention.

A hollow stationary shaft 47 is provided vertically on a base 46. A rotation post 40 is rotatably mounted to the stationary shaft 47, and the shelf plates 38 are fixed to the rotation post 40. A rotation shaft 48 passing through the stationary shaft 47 is rotatably provided in the stationary shaft 47. An upper end of the rotation shaft 48 is fixed to a connection block 49, and the connection block 49 is fixed to the rotation post 40. The rotation shaft 48 and the shelf plate 38 are connected to each other through the connection block 49 and the rotation post 40 so that the rotation shaft 48 and the shelf plate 38 can rotate as one unit.

A driving motor 41 is connected to a lower end of the rotation shaft 48 through a speed reducing mechanism 39.

The speed reducing mechanism 39 comprises a first speed reducer 42 and a second speed reducer 43. The first speed reducer 42 is provided in its power transmitting mechanism with a harmonic speed reducer (tradename), and the second speed reducer 43 is provided with a worm 44 and a worm wheel 45.

Figure 5:
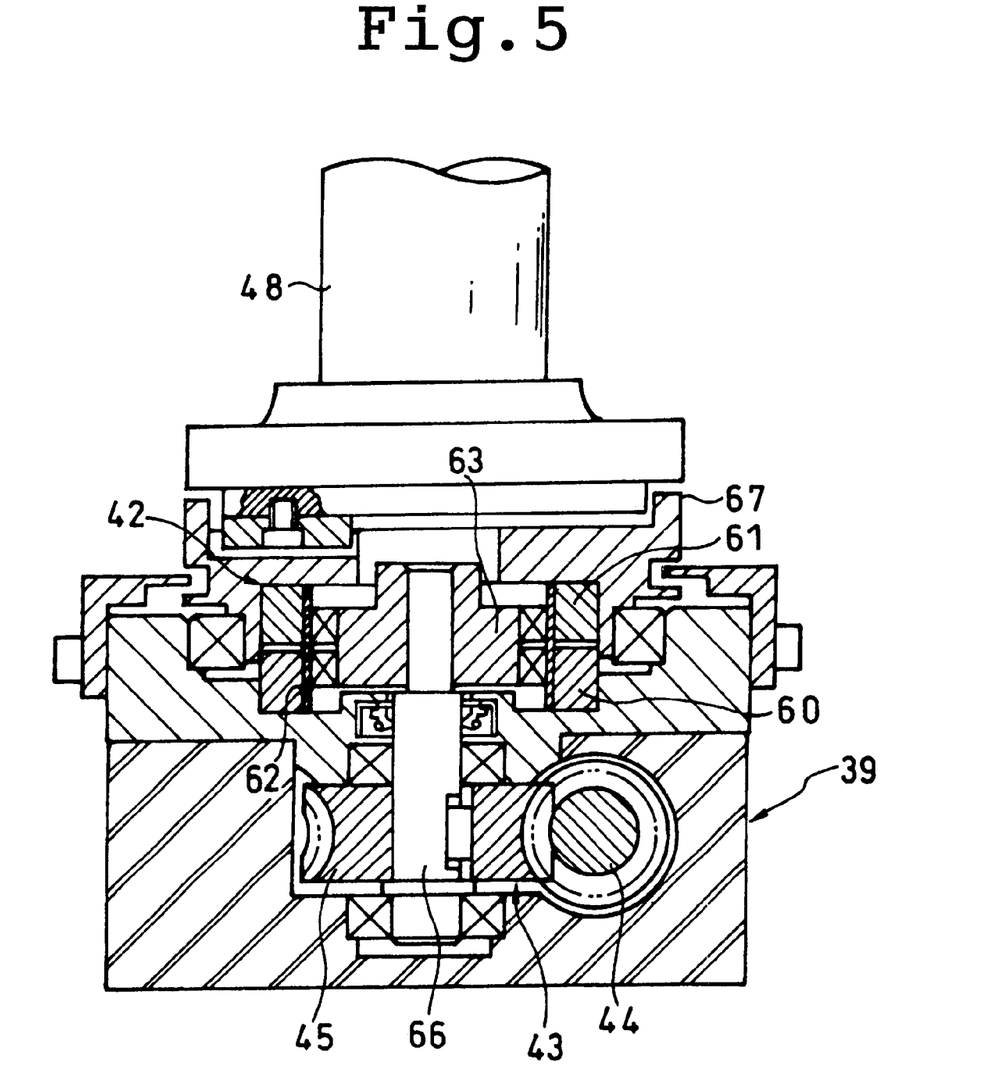
FIG. 5 is a sectional view taken along a line AA in FIG. 4.
Figure 6:
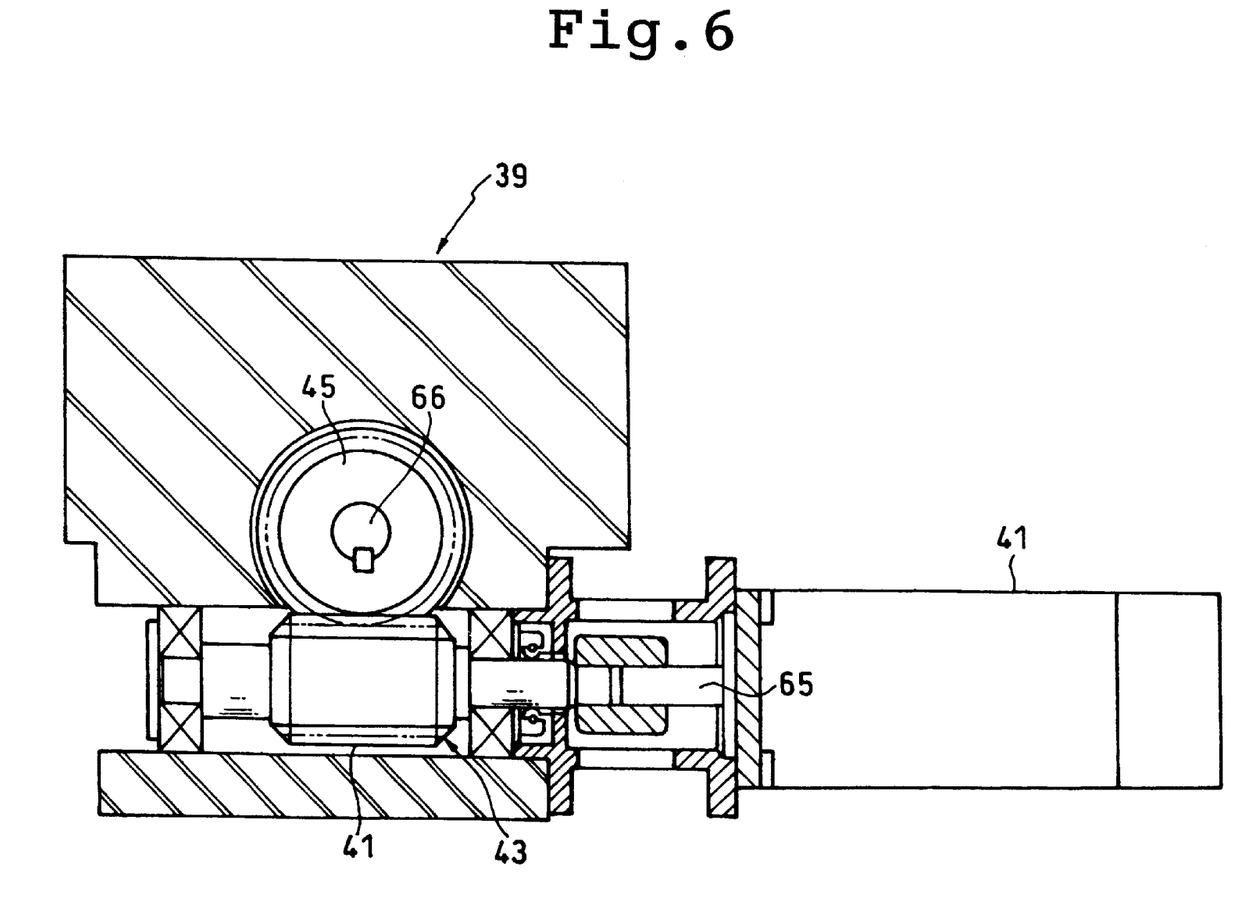
FIG. 6 is a sectional view taken along a line BB in FIG. 4.

The harmonic speed reducer comprises a pair of upper and lower internal ring gears 60 and 61 having high rigidity, a thin and flexible cylindrical external gear 62 having a diameter smaller than those of the internal ring gears 60 and 61, and an elliptic rotor 63 which is fitted into the cylindrical external gear 62. The cylindrical external gear 62 partially meshes with the internal ring gears 60 and 61 through a long diameter portion of the rotor 63 under the existence of the rotor 63. When the internal ring gear 60 is fixed and the rotor 63 is rotated, the internal ring gears 60, 61 and the cylindrical external gear 62 are deviated from each other by a distance corresponding to a difference in the number of teeth between the internal ring gears 60, 61 and the cylindrical external gear 62, the cylindrical external gear 62 rotates, and the internal ring gear 61 rotates. Therefore, the rotation of the rotor 63 is largely decelerated and transmitted to the internal ring gear 61. The harmonic speed reducer has a great deceleration ratio ad a high meshing rate.

An output shaft 65 of the driving motor 41 is connected to the worm 44, and a rotation shaft 66 of the worm wheel 45 is connected to the rotor 63. The internal ring gear 61 is connected to the rotation shaft 48 through a coupling 67. Rotation of the driving motor 41 is decelerated in two stages by the first speed reducer 42 and the second speed reducer 43, and transmitted to the rotation shaft 48. The harmonic speed reducer has a high meshing rate, few backlash and a high deceleration ratio and therefore, backlash between the worm 44 and the worm wheel 45 is not transmitted to the rotation shaft 48 almost at all. Therefore, the precision of positioning and stopping of the shelf plate 38 is high. Further, if a motor which can be controlled such as a servomotor is used as the driving motor, it is possible to rotate the FOUP rotation accommodating shelf 36 intermittently with high precision.

The rotation shaft 48 is provided with a rotational position detecting plate 68, and the base 46 is provided with a position detecting sensor 69. With this structure, a homing position of the FOUP rotation accommodating shelf 36 can be detected by the position detecting sensor 69. The FOUP rotation accommodating shelf 36 is rotated and positioned such that the radial lines defines the necessary angle α with reference to the homing position.

The operation will be explained below.

The wafers 12 are transferred in a state where the wafers 12 are loaded in the FOUP 13. The FOUP 13 is transferred onto the FOUP stage 21 by the AGV transfer method or the OHT method in a state where the open face 14 is directed rearward. There is no sub-accommodating shelf and the like above the FOUP stage 21 and transfer space can be secured in front and above the FOUP stage 21. Therefore, any one of the AGV transfer method or the OHT method can be employed.

The FOUP transfer machine 22 receives the FOUP 13 from the FOUP stage 21 through the FOUP IN/OUT port 20 in the state where the open face 14 is directed rearward and then, the FOUP transfer machine 22 is opposed to the FOUP sending/receiving position of the FOUP rotation accommodating shelf 36 by vertical movement, rotation movement and lateral movement.

Together with the transferring movement of the FOUP transfer machine 22, the driving motor 41 is driven, thereby rotating the shelf plate 38 through the speed reducing mechanism 39 and the rotation shaft 48. The shelf plate 38 is stopped at a position where a FOUP accommodating position of the shelf plate 38 is opposed to the FOUP stage 21. FOUP 13 is accommodated at the FOUP accommodating position by the FOUP transfer machine 22 in a state where the open face 14 is directed rearward. By repeating the above transferring movement, the predetermined number of FOUPs 13 are transferred into the FOUP rotation accommodating shelf 36.

Next, the FOUP rotation accommodating shelf 36 is driven, and the FOUP 13 from which wafers are to be moved is positioned at the sending/receiving position. The FOUP 13 is transferred from the FOUP rotation accommodating shelf 36 to the FOUP sending/receiving unit 24 by the FOUP transfer machine 22. In the case of the apparatus shown in FIG. 1, two FOUPs 13 are placed onto the FOUP sending/receiving unit 24.

The lid 15 of the FOUP 13 is opened, the wafers 12 are moved from the FOUP 13 to the boat 30 by the wafer transfer machine 31 through the wafer IN/OUT port 28. When the wafers 12 in the FOUP 13 runs out, the FOUP 13 on the FOUP sending/receiving unit 24 is returned to the FOUP rotation accommodating shelf 36, and a new FOUP 13 is transferred to the FOUP sending/receiving unit 24, and the above operation is repeated until the predetermined number of wafers 12 are placed on the boat 30.

The boat 30 is inserted into the reaction furnace 29, and the wafers 12 are processed. The processed wafers 12 are moved to the FOUP 13 on the FOUP sending/receiving unit 24 and the FOUP 13 is transferred from the FOUP sending/receiving unit 24 to the FOUP rotation accommodating shelf 36 by reversing the above procedure.

When the FOUPs 13 are to be transferred outside from the FOUP rotation accommodating shelf 36, the reversed procedure of the transferring in operation is carried out.

Although the number of FOUPs 13 capable of being accommodated in and taken out from the FOUP rotation accommodating shelf 36 by one operation of the FOUP transfer machine 22 is only one, the throughput can be enhanced by operating the FOUP transfer machine 22 and the FOUP rotation accommodating shelf 36 together with the opening/closing operation of the lid open/close mechanism (not shown) and the moving operation of the wafers 12 by the wafer transfer machine 31.

(Second Embodiment)

Next, a second embodiment of the present invention will be explained with reference to FIG. 7.

Figure 7:
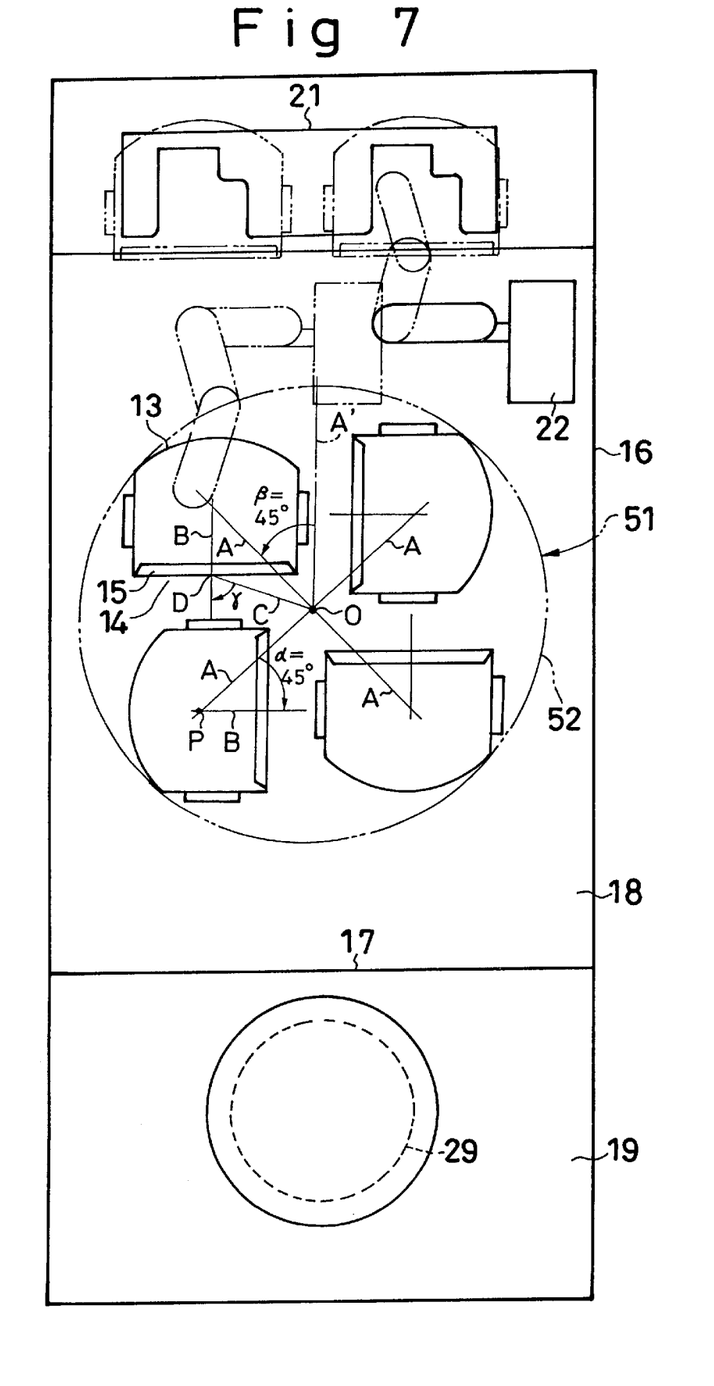
FIG. 7 is a schematic transversal sectional view for explaining a substrate processing apparatus according to a second embodiment of the present invention.

In FIG. 7, member which are the same as those shown in FIGS. 1 to 6 are designated with the same numbers, and explanation thereof is omitted. Since the operation in the second embodiment is the same as that in the first embodiment, explanation thereof is also omitted.

Three column shelf plates 52 are provided in an FOUP rotation accommodating shelf 52. Each of the shelf plates 52 can accommodate four FOUPs 13 respectively on four radial lines A passing through a rotation center O of the FOUP rotation accommodating shelf 51. That is, the four FOUPs 13 are disposed at positions at an equal distance from the rotation center point O, and angles defined between adjacent two radial lines are equal to one another. Twelve FOUPs 13 in total can be accommodated in the FOUP rotation accommodating shelf 51. The FOUPs 13 are disposed on each of the shelf plates 52 such that an angle α defined between the line B perpendicular to the open face 14 of the FOUP 13 and passing through the centroid P of the FOUP 13 and the radial line A passing through the rotation center O of the FOUP rotation accommodating shelf 51 is 45°, for example. That is, each of the FOUPs 13 is disposed on a position deviated by an offset angle of α (=45°) from each of the radial lines A. At this time, a line B perpendicular to the open face 14 at a central position D of the open face 14 and a straight line C passing through the central position D and the rotation center point O is inclined by an angle γ with respect to each other. In the second embodiment, the FOUP 13 is sent and received at a position deviated laterally by β=45° from the center line A'.

(Third Embodiment)

Next, a third embodiment of the invention will be explained with reference to FIG. 8.

Figure 8:
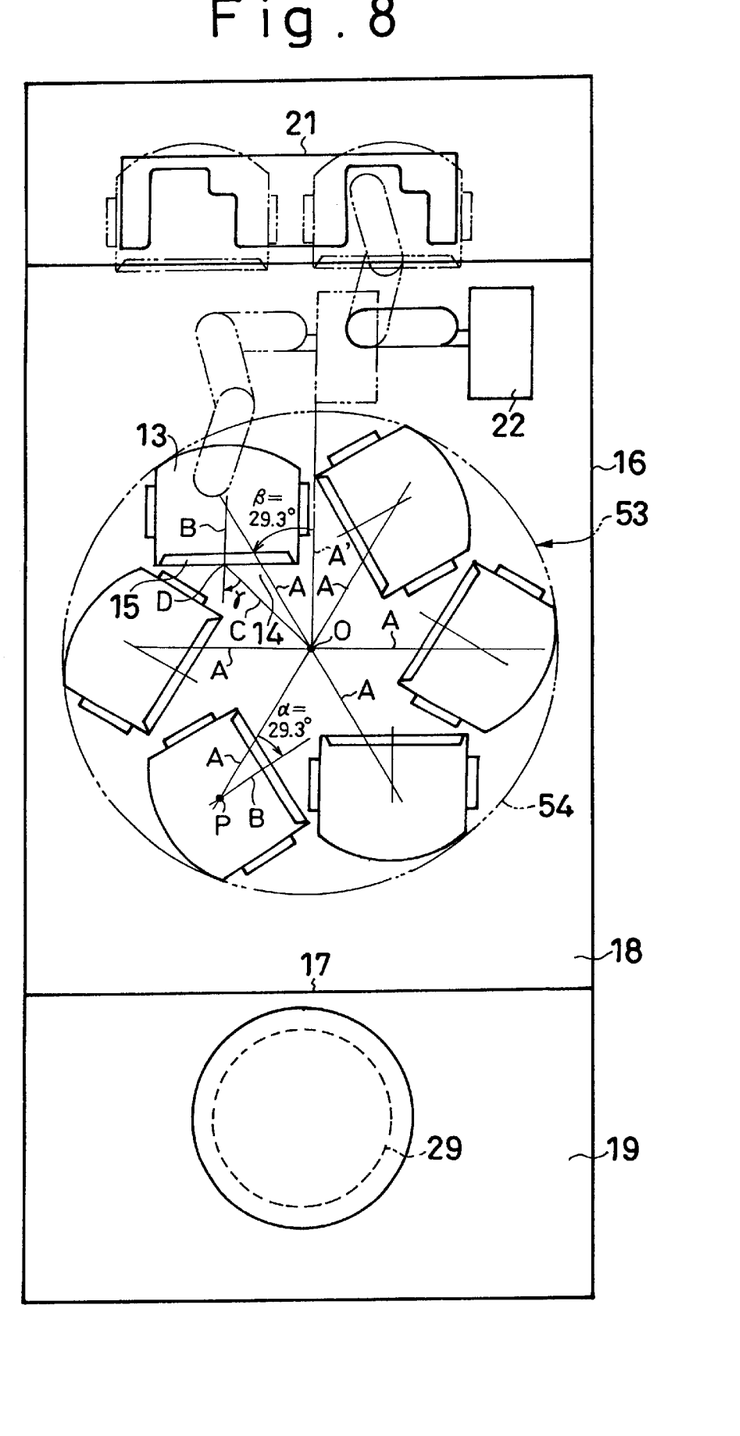
FIG. 8 is a schematic transversal sectional view for explaining a substrate processing apparatus according to a third embodiment of the present invention.

In FIG. 8, member which are the same as those shown in FIGS. 1 to 6 are designated with the same numbers, and explanation thereof is omitted. Since the operation in the third embodiment is the same as that in the first embodiment, explanation thereof is also omitted.

Three column shelf plates 54 are provided in an FOUP rotation accommodating shelf 53. Each of the shelf plates 54 can accommodate six FOUPs 13. That is, the six FOUPs 13 are disposed at positions at an equal distance from the rotation center point O, and angles defined between adjacent two radial lines are equal to each other. Eighteen FOUPs 13 in total can be accommodated in the FOUP rotation accommodating shelf 53. The FOUPs 13 are disposed on each of the shelf plates 54 such that an angle α defined between the lines B perpendicular to the open face 14 of the FOUP 13 and passing through the centroid P of the FOUP 13 and the radial line A passing through the rotation center O of the FOUP rotation accommodating shelf 53 is 29.3° for example. That is, each of the FOUPs 13 is disposed on a position deviated by an offset angle of α (=29.3°) from each of the radial lines A. At this time, a line B perpendicular to the open face 14 at a central position D of the open face 14 and a straight line C passing through the central position D of the open face 14 and the rotation center point O is inclined by an angle of γ with respect to each other. In the third embodiment, the FOUP 13 is sent and received at a position deviated laterally through 29.3° from the center line A'.

In the above embodiments have been described while taking, as an example, the case where the wafers 12 are transferred in a state where the wafers 12 are loaded in the FOUP 13, it is needless to say that the present invention can also be carried out in a case where the wafers 12 are loaded and transferred within an open type accommodating container such as a wafer cassette or in a closed type accommodating container other than the FOUP 13.

Further, the number of FOUPs 13 to be accommodated in each of the shelf plates of the FOUP rotation accommodating shelf 36, 51 or 53 should not be limited to the above-described number, and three or less, or seven or more FOUPs 13 may be accommodated.

Further, the angle defined between the radial line and the orientation of the FOUP 13 shown in the above first to third embodiments is not uniquely determined by the number of radial lines, and there is a possibility that the angle is varied depending upon a shape of the FOUP 13. In short, the angle is preferably determined such that when the FOUP 13 is opposed to the FOUP stage 21 and the FOUP transfer machine 22 and is transferred at that position, the FOUP being transferred dose not interfere with the adjacent FOUPs 13. When the FOUP 13 is asymmetrical in shape, the radial line does not always passes through the centroid of the FOUP 13 of course.

As described above, according to the present invention, a size of the FOUP rotation accommodating shelf in plane is not determined by a width of the open face of the accommodating container, and the accommodating container can efficiently be accommodated in the rotation accommodating shelf in plane without generating wasteful space. Therefore, a diameter of rotation circle of the rotation accommodating shelf can be reduced, the rotation accommodating shelf is reduced in size, and the installation space for the apparatus can be saved.

In the case of the rotation accommodating shelf capable of accommodating four accommodating containers on each of the shelf plates, when the number of accommodating containers for two batches is twelve or less, it is unnecessary to provided additional accommodating shelves in addition to the rotation accommodating shelf. In the case of the rotation accommodating shelf capable of accommodating five or more accommodating containers on each of shelf plates, it is possible to accommodate, in the apparatus, fourteen or more accommodating containers which are enough for normal processing, and not only when the normal processing is carried out, but also when the number of substrates to be processed in one batch is increased, it is unnecessary to provided additional accommodating shelves in additional to the rotation accommodating shelf. Therefore, the accommodating containers can be transferred in the apparatus from above and front and thus, it is possible to exhibit various excellent effects that the accommodating containers can flexibly be transferred with various transferring systems with one apparatus.

What is claimed is:

1. A substrate processing apparatus, comprising:
    a rotation accommodating shelf rotating in a horizontal plane capable of accommodating a plurality of accommodating containers, each container comprising at least one wall, and wherein the containers are distinct from and disposed on the rotation accommodation shelf, in which substrates are to be loaded and having a rotation mechanism for rotating said rotation accommodating shelf, and a transfer machine for transferring and disposing said plurality of accommodating containers to said rotation accommodating shelf when said rotation accommodation shelf is stationary, wherein
    said plurality of accommodating containers are respectively disposed on radial lines, which radiate from a rotation center of said rotation accommodating shelf, such that each accommodating container is respectively inclined in a horizontal plane in a same fixed direction with respect to a radial line.

2. The substrate processing apparatus as recited in claim 1, wherein centroids of said accommodating containers are disposed at positions separated from said rotation center at equal distances.

3. The substrate processing apparatus as recited in claim 1, wherein angles defined between adjacent two of said radial lines are equal to one another.

4. The substrate processing apparatus as recited in claim 1, wherein said accommodating container is disposed such that a direction in which a substrate is transferred into and out from said accommodating container is inclined with respect to said radial line.

5. The substrate processing apparatus as recited in claim 1, wherein said accommodating container is disposed such that a line perpendicular, at a central portion of an open face of said accommodating container into and out from which a substrate is transferred, to said open face of said accommodating container is inclined with respect to a straight line passing through said central portion of said open face and said rotation center of said rotation accommodating shelf.

6. The substrate processing apparatus as recited in claim 1, wherein said accommodating container is disposed to be inclined with respect to said radial line such that said transfer machine can send or receive said accommodating container at an accommodating container sending/receiving position where said transfer machine sends said accommodating container which is to be disposed in said rotation accommodating shelf or receives said accommodating container disposed in said rotation accommodating shelf.

7. The substrate processing apparatus as recited in claim 6, wherein said accommodating container is disposed in said rotation accommodating shelf such that said accommodating container is opposed to said transfer machine at said accommodating container sending/receiving position.

8. The substrate processing apparatus as recited in claim 6, wherein said accommodating containers are disposed in said rotation accommodating shelf such that when said transfer machine sends or receives one of said accommodating containers to or from said accommodating container sending/receiving position, the other accommodating containers disposed at positions except said accommodating container sending/receiving position of said rotation accommodating shelf do not interfere with the sending or receiving operation of said one of said accommodating containers with respect to said accommodating container sending/receiving position.

9. The substrate processing apparatus as recited in claim 1, wherein an accommodating container sending/receiving position, wherein said transfer machine sends said accommodating container which is to be disposed in said rotation accommodating shelf or receives said accommodating container disposed in said rotation accommodating shelf, is deviated laterally from a center line of said substrate processing apparatus.

10. The substrate processing apparatus as recited in claim 1, further comprising an accommodating container IN/OUT section for transferring said accommodating container into or out from said substrate processing apparatus, wherein
    an orientation of said accommodating container at an accommodating container sending/receiving position, where said transfer machine sends said accommodating container which is to be disposed in said rotation accommodating shelf or receives said accommodating container disposed in said rotation accommodating shelf, is the same as an orientation of said accommodating container disposed on said accommodating container IN/OUT section.

11. The substrate processing apparatus as recited in claim 1, wherein said accommodating containers are respectively inclined at same angles with respect to said radial lines.

12. A substrate processing apparatus, comprising:
    a rotation accommodating shelf capable of accommodating a plurality of accommodating containers, each container comprising at least one wall, and wherein the containers are distinct from and disposed on the rotation accommodation shelf, in which substrates are to be loaded and having a rotation mechanism for rotating said rotation accommodating shelf in a horizontal plane, and a transfer machine for transferring and disposing said plurality of accommodating containers to said rotation accommodating shelf when said rotation accommodation shelf is stationary, wherein said plurality of accommodating containers are respectively disposed on radial lines, which radiate from a rotation center of said rotation accommodating shelf, such that each accommodating container is respectively inclined in a horizontal plane in a same fixed direction with respect to a radial line; and said accommodating container is disposed to be inclined with respect to said radial line such that said transfer machine can send or receive said accommodating container at an accommodating container sending/receiving position where said transfer machine sends said accommodating container which is to be disposed in said rotation accommodating shelf or receives said accommodating container disposed in said rotation accommodating shelf.

13. The substrate processing apparatus as recited in claim 12, wherein said accommodating container is disposed in said rotation accommodating shelf such that said accommodating container is opposed to said transfer machine at said accommodating container sending/receiving position.

14. The substrate processing apparatus as recited in claim 12, wherein said accommodating containers are disposed in said rotation accommodating shelf such that when said transfer machine sends or receives one of said accommodating containers to or from said accommodating container sending/receiving position, the other accommodating containers disposed at positions except said accommodating container sending/receiving position of said rotation accommodating shelf do not interfere with the sending or receiving operation of said one of said accommodating containers with respect to said accommodating container sending/receiving position.

15. A substrate processing apparatus, comprising:

a rotation accommodating shelf capable of accommodating a plurality of accommodating containers, each container comprising at least one wall, and wherein the containers are distinct from and disposed on the rotation accommodation shelf, in which substrates are to be loaded, and a transfer machine for transferring said plurality of accommodating containers to said rotation accommodating shelf, wherein said plurality of accommodating containers are respectively disposed on radial lines, which radiate from a rotation center of said rotation accommodating shelf, such that each accommodating container is respectively inclined in a horizontal plane in a same fixed direction with respect to a radial line.

16. The substrate processing apparatus as recited in claim 15, wherein centroids of said accommodating containers are disposed at positions separated from said rotation center at equal distances.

17. The substrate processing apparatus as recited in claim 15, wherein angles defined between adjacent two of said radial lines are equal to one another.

18. The substrate processing apparatus as recited in claim 15, wherein said accommodating container is disposed such that a direction in which a substrate is transferred into and out from said accommodating container is inclined with respect to said radial line.

19. The substrate processing apparatus as recited in claim 15, wherein said accommodating container is disposed such that a line perpendicular, at a central portion of an open face of said accommodating container into and out from which a substrate is transferred, to said open face of said accommodating container is inclined with respect to a straight line passing through said central portion of said open face and said rotation center of said rotation accommodating shelf.

20. The substrate processing apparatus as recited in claim 15, wherein said accommodating containers are respectively inclined at same angles with respect to said radial lines.

* * * * *